(12) United States Patent
Chen

(10) Patent No.: US 7,494,250 B2
(45) Date of Patent: Feb. 24, 2009

(54) LIGHT EMITTING MODULE AND PROCESS THEREOF

(76) Inventor: Chien Chung Chen, 2F., No. 5, Lane 166, Chung Yang Rd., Nan Kang District, Taipei City 115 (TW)

( * ) Notice: Subject to any disclaimer, the term of this patent is extended or adjusted under 35 U.S.C. 154(b) by 115 days.

(21) Appl. No.: 11/503,216

(22) Filed: Aug. 14, 2006

(65) Prior Publication Data

US 2007/0170563 A1    Jul. 26, 2007

(30) Foreign Application Priority Data

Jan. 26, 2006   (TW)   ............... 95103217 A

(51) Int. Cl.
 *F21V 29/00* (2006.01)
(52) U.S. Cl. ............ 362/294; 362/800; 362/555; 362/373; 257/99
(58) Field of Classification Search ............ 362/800, 362/294, 373, 555; 361/704–705; 257/99–100, 257/712, 720
 See application file for complete search history.

(56) References Cited

U.S. PATENT DOCUMENTS

| | | | | |
|---|---|---|---|---|
| 5,534,718 A | * | 7/1996 | Chang | .......... 257/98 |
| 6,034,712 A | * | 3/2000 | Iwasaki | .......... 347/241 |
| 6,517,218 B2 | * | 2/2003 | Hochstein | .......... 362/294 |
| 7,030,423 B2 | * | 4/2006 | Chang et al. | .......... 257/98 |
| 7,138,667 B2 | * | 11/2006 | Barnett et al. | .......... 257/99 |
| 2005/0133808 A1 | * | 6/2005 | Uraya et al. | .......... 257/99 |
| 2005/0231983 A1 | * | 10/2005 | Dahm | .......... 362/800 |

\* cited by examiner

*Primary Examiner*—Jong-Suk (James) Lee
*Assistant Examiner*—Robert May
(74) *Attorney, Agent, or Firm*—Rabin & Berdo, P.C.

(57) ABSTRACT

A light emitting module includes a metal substrate, a bearing base, at least one LED, a printed circuit board, and at least one conductive wire. A first perforation is formed on the metal substrate and the bearing base is embedded into the first perforation of the metal substrate. According to an eutectic soldering method, the LED(s) is/are adhered on the bearing base by a compound metal. A second perforation is formed on the printed circuit board to expose the LED(s) which is/are adhered on the bearing base and further allows the printed circuit board to stick on the metal substrate. The conductive wires are used to connect electrically the LED(s) with the printed circuit board.

19 Claims, 8 Drawing Sheets

LIGHT EMITTING MODULE AND PROCESS THEREOF

BACKGROUND OF THE INVENTION

1. Field of the Invention

The present invention is generally related to a light emitting module and process thereof, and more particularly, a light emitting diode used as a lighting source for the light emitting module and process thereof.

2. Description of Related Art

Over recent years the technology behind light emitting diodes has developed rapidly, especially compared to that of traditional Incandescent Lamps. HP LEDs (High-power light emitting diodes) are seen as better illumination devices because the over greater power saving, a longer usage life, high durability and faster responding speeds. Because of these advantages, light emitting diodes have become more common in different fields, such as the general lighting market, public works and for automobiles. Further facilitating these are other markets that require this kind of light emitting diodes which are continuing to grow.

However, a big problem is how to overcome the usage life being shortened and efficiency reduced due to excessive temperatures. Please refer to FIG. 1 which illustrates a structural cross-sectional view for a traditional panel type light emitting module. Shown in FIG. 1 is a printed circuit board 3 attached to a metal substrate 1 by an insulation colloid 30 that prevents a short circuit from occurring. The metal substrate 1 can be built with a fillister to adhere the die(s) of light emitting diode 2 directly. Alternatively, the light emitting diode 2 is adhered to the metal substrate 1 by a silver epoxy 20 to conduct heat. Finally, conductive wires 4 are connected between the light emitting diode 2 and the printed circuit board 3 for electrical connection.

Please refer to FIG. 2 which illustrates another structural cross-sectional view for a traditional light emitting module. FIG. 2 shows one kind of lead frame type light emitting diode module. A bearing base 5 is disposed within an insulation housing 70 to carry a light emitting diode 2. Furthermore, the light emitting diode 2 is adhered to the bearing base 5 by a silver epoxy 20. Conductive wires 4 electronically connect the light emitting diode 2 to a first lead frame 61 and a second lead frame 62 separately. The bearing base, first lead frame 61 and the second lead frame 62 are prevented from electronically connecting by the insulation housing 70.

The most of above mentioned conventional light emitting modules are using silver epoxy 20 as a heat conduction medium. However, for conducting heat for a high power light emitting diode 2, the silver epoxy 20 is still deficient, and that makes the light emitting diode 2 heat dissipation comparatively slow. Even after installing additional heat dissipation mediums (such as a Heat Sink) under the metal substrate 1 or the bearing base 5, it is still unable to dissipate more heat because the actual heat energy is unable to be conducted to the heat dissipation medium effectively. For that reason, operators sometimes misconceive that the temperature of the overall light emitting module is not very high and assumes the light emitting diode 2 is still able to work at safety condition. However, in reality, the light emitting diode 2 itself is in danger of being damaged, because the heat energy is unable to be conducted.

In order to improve the heat dissipation performance, silver epoxy 20 with high thermal conductivity can be used, however it will be too expensive to build a reasonably low cost commercial product. Improved high thermal conductivity silver epoxy 20 is also difficult to preserve and solidifies easily as general silver epoxy 20. Moreover, if it is used on a higher power LED module, it is still not good enough to conduct heat energy effectively and quickly.

SUMMARY OF THE INVENTION

In view of this, one object of the present invention provides a light emitting module and process thereof to conduct heat energy more effectively and quickly and further reduces the temperature of an LED according to a medium and process thereof that is able to conduct both electricity and heat.

In order to solve the above-mentioned problems, the present invention provides a light emitting module comprising a metal substrate, a bearing base, at least one LED, a printed circuit board, and at least one conductive wire. A first perforation is formed on the metal substrate and the bear base is embedded into the first perforation of the metal substrate. By using eutectic soldering method, the LED die(s) is/are adhered on the bearing base by a compound metal. A second perforation is formed on the printed circuit board to expose the LED(s) which is/are adhered on the bearing base and further allows the printed circuit board to stick on the metal substrate. The conductive wires are used to connect electrically the LED(s) with the printed circuit board.

In order to solve the above-mentioned problems, the present invention another provides a process for a light emitting module. The process comprises the steps of: providing a metal substrate with a first perforation, embedding a bearing base into the first perforation of the metal substrate, adhering at least one LED on the bearing base via eutectic soldering under a high-temperature state, and further sticking a printed circuit board with a second perforation on the metal substrate, wherein the second perforation exposes the LED which is located on the bearing base, and electrically connects the LED to the printed circuit board through at least one conductive wire.

The general description above and the following details as well as the drawings are all used to further illustrate those manners, means, and efficacies employed in the present invention to achieve the desired purposes. And other purposes and advantages of the present invention will be explained also in the following descriptions and drawings.

DETAILED DESCRIPTION OF THE PREFERRED EMBODIMENTS

Figure 1:
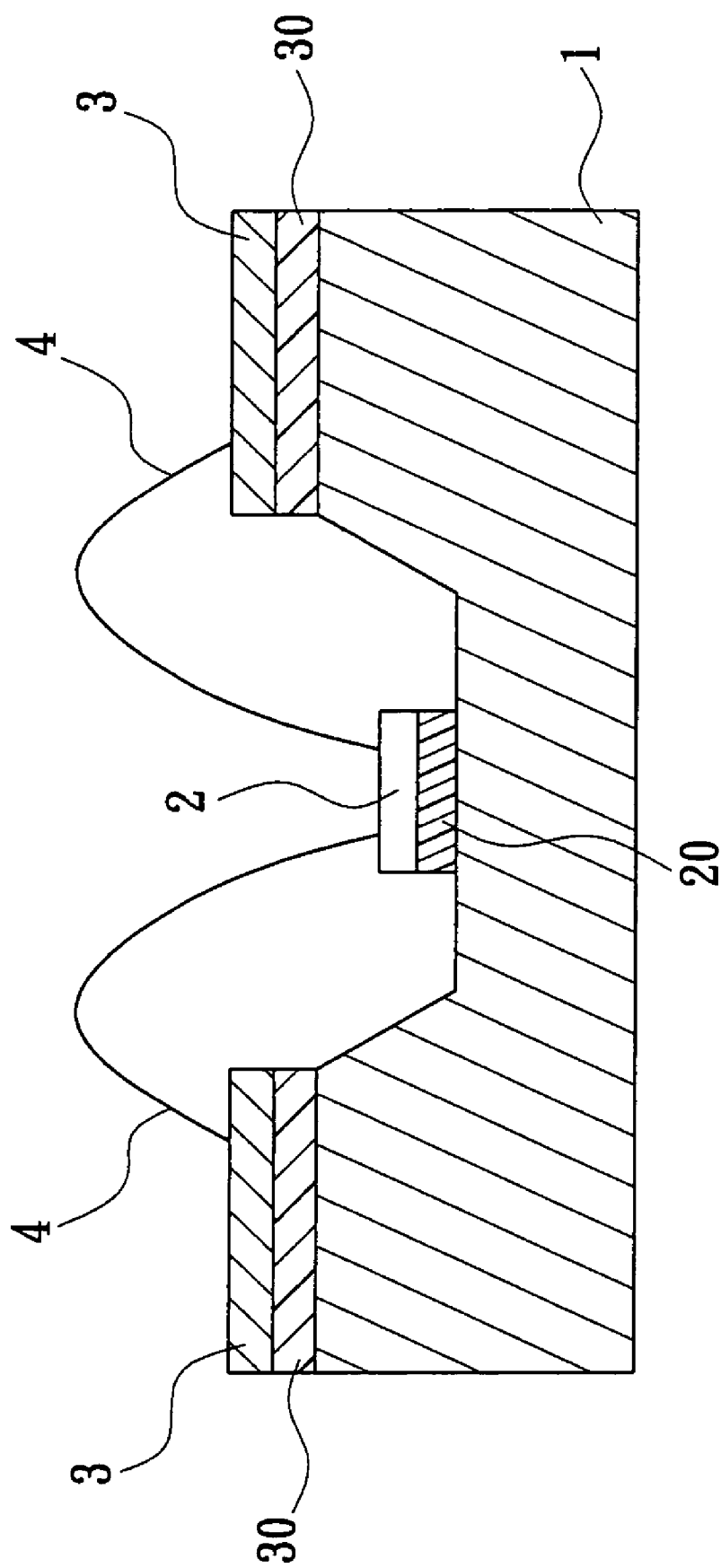
FIG. 1 is a structural cross-sectional view which illustrates a traditional light emitting module.
Figure 2:
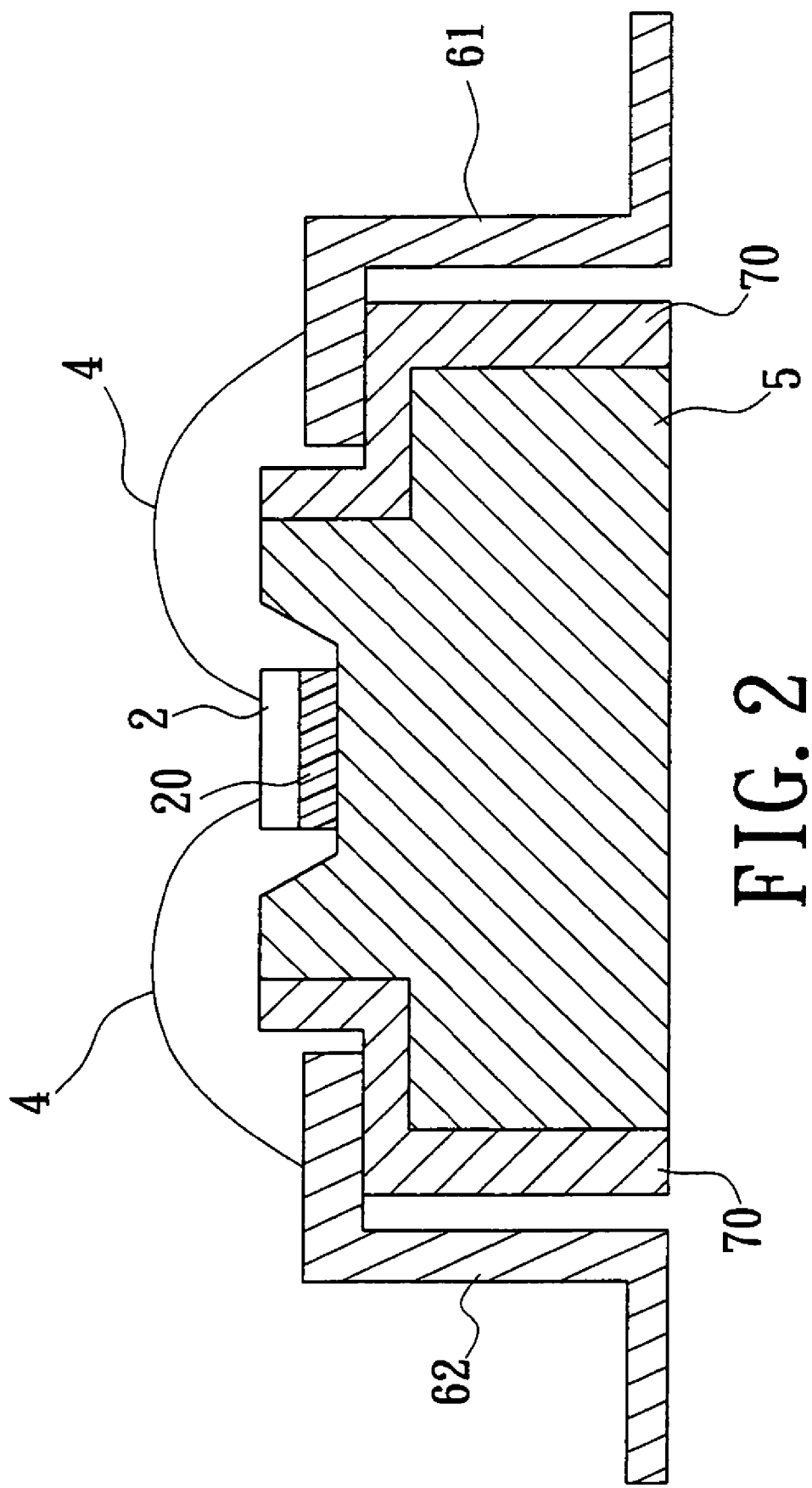
FIG. 2 is a structural cross-sectional view which illustrates another traditional light emitting module.
Figure 3:
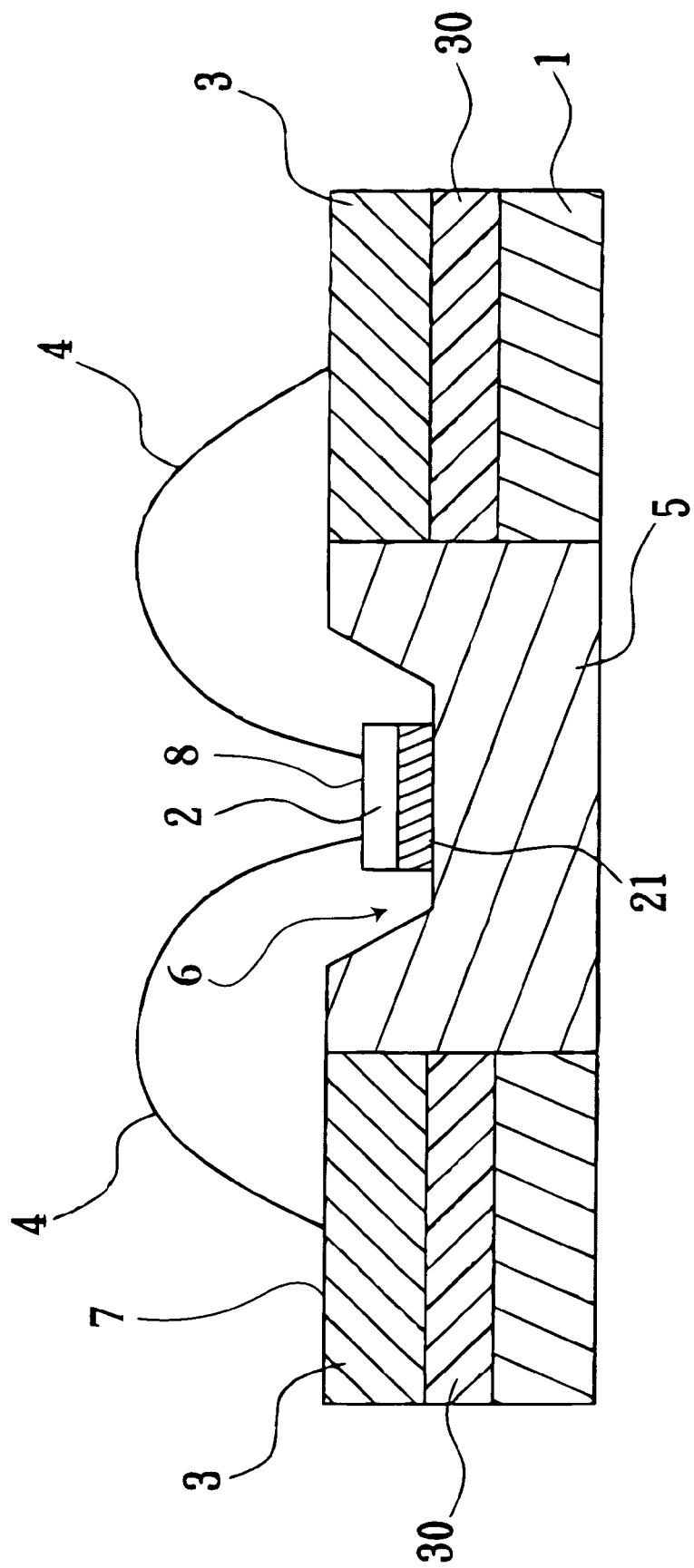
FIG. 3 is a structural cross-sectional view which illustrates a light emitting module according to an embodiment of the present invention.

FIG. 3 is a structural cross-sectional view which illustrates a light emitting module according to an embodiment of the present invention. As shown by FIG. 3, the present invention provides a light emitting module comprising a metal substrate 1, at least one LED 2, a printed circuit board 3, at least one conductive wire 4 and a bearing base 5. The bearing base 5 is disposed on the metal substrate 1 and has a recess 6 defined therein and the printed circuit board 3 is stuck on the metal substrate 1 through an insulation colloid 30. The printed circuit board 3 has a first, or top, surface 7. The LED 2 is adhered on the bearing base 5, and more specifically within the recess 6, through a compound metal via the method of eutectic soldering. The LED 2 has a first, or top, surface 8, wherein the LED top surface 8 is positioned substantially below the top surface 7 of the printed circuit board 3. The LED 2 is electrically connected to the printed circuit board 3 though the conductive wires 4 separately. Wherein, the compound metal 21 may consist of gold and tin (or silver and tin) which is a medium with high thermal conductive coefficient. Because of the characteristic of the compound metal 21, it is able to conduct more effectively the heat energy which is produced by the LED 2.

Figure 4:
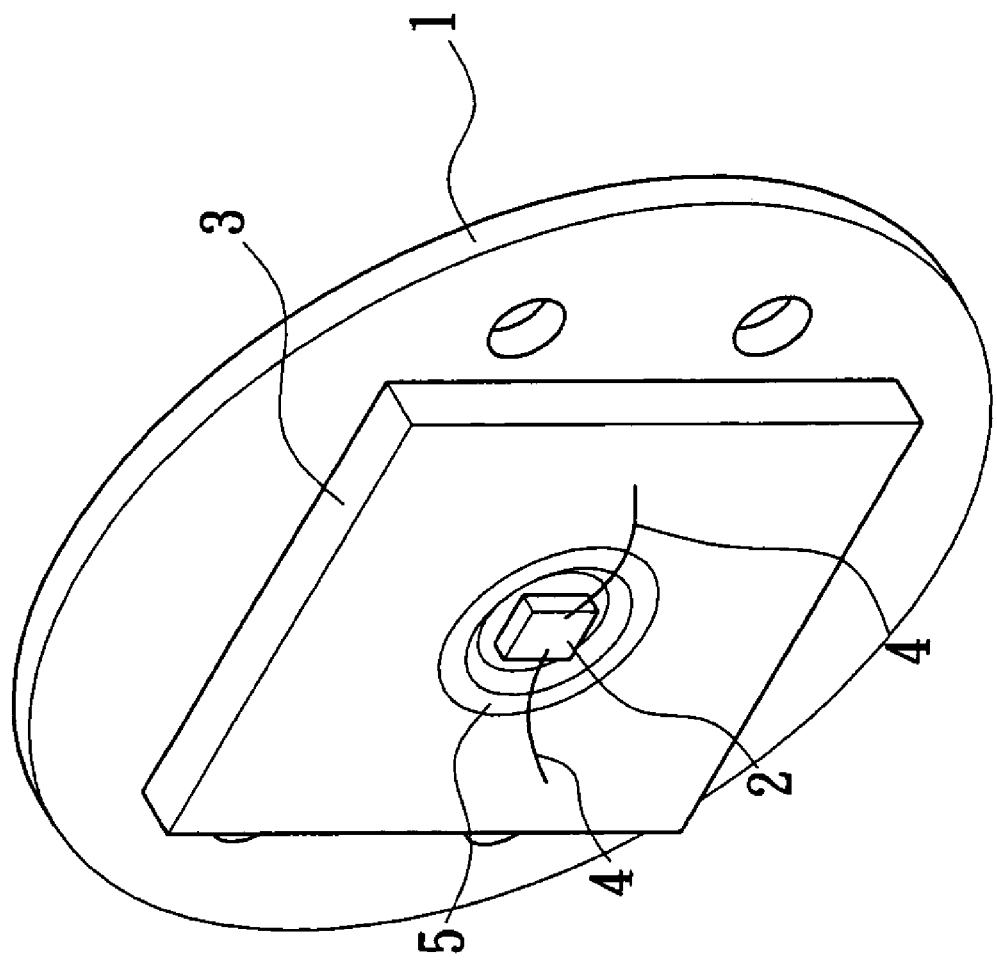
FIG. 4 is a schematic diagram which illustrates a light emitting module according to an embodiment of the present invention.
Figure 5:
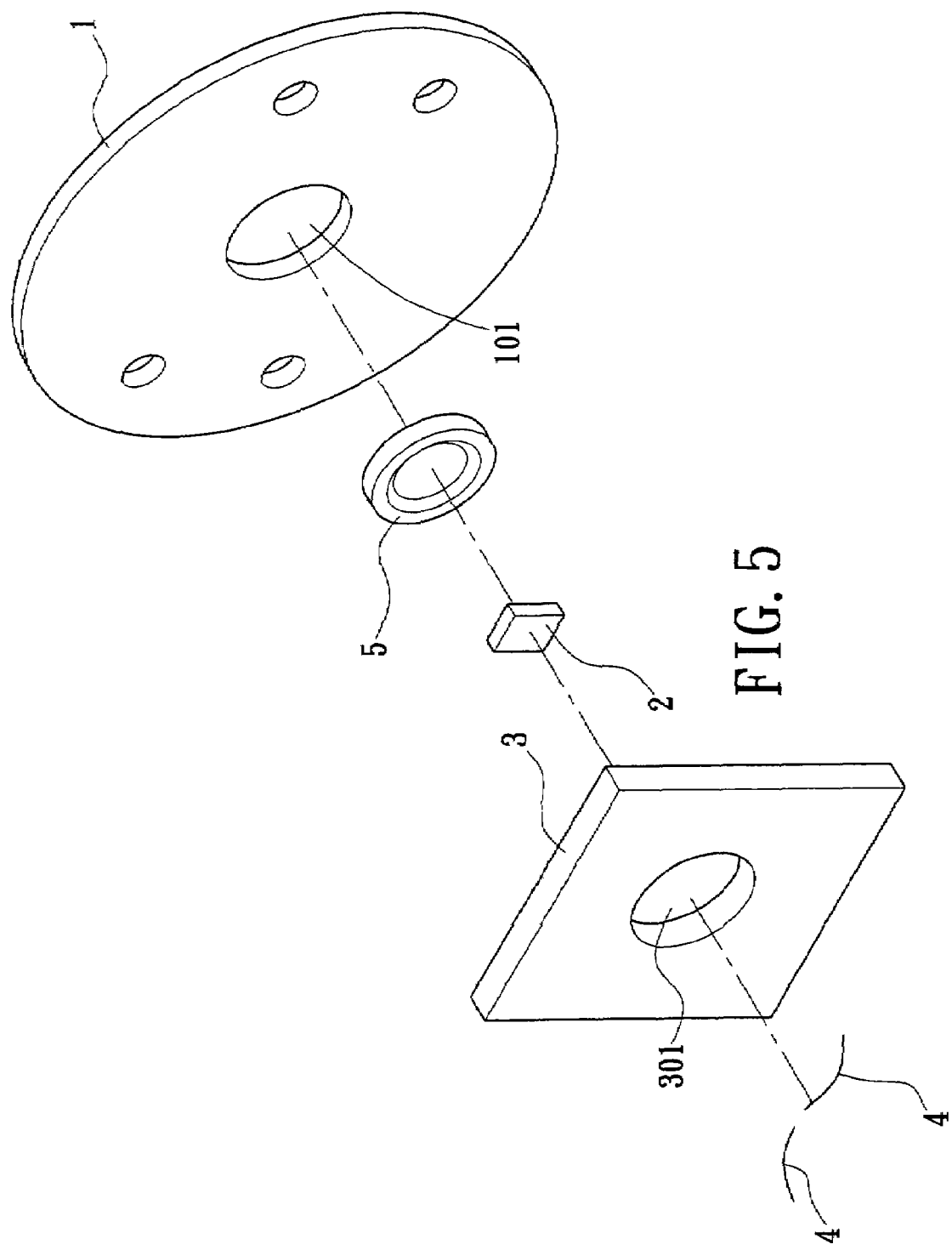
FIG. 5 is an exploded view which illustrates a light emitting module according to an embodiment of the present invention.

FIG. 4 and FIG. 5 represent a schematic diagram and an exploded view which illustrate a light emitting module according to an embodiment of the present invention. The light emitting module comprises a metal substrate 1, at least one LED 2, a printed circuit board 3, at least one conductive wire 4 and a bearing base 5. The material of the metal substrate 1 may be copper or aluminum and a first perforation 101 is formed on the metal substrate 1 to allow the bearing base 5 to be embedded into the metal substrate 1. The size of the first perforation corresponds to the size of the bearing base 5. The material of the bearing base 5 may be one kind of metal, such as copper, and the surface layer of the bearing base 5 may be electroplated by gold or silver.

Moreover, the LED 2 is adhered on the bearing base 5 by a compound metal 21 via the method of eutectic soldering. The compound metal consists of gold and tin, or silver and tin. The electroplated surface layer of the bearing base 5 mentioned above not only increases the rate of reflection but also improves the quality of adhesion when LED 2 is eutectic soldered with the compound metal 21. A second perforation is formed on the printed circuit board 3 to expose the LED 2 which is on the bearing base 5 and make the printed circuit board 3 further stick on the metal substrate 1 through a material, such as an insulation colloid 30 (as shown in FIG. 3). The printed circuit board 3 also has an electronic circuit (not shown in Figs) to control the LED 2 for radiating. The conductive wires 4 are electrically connected to the LED 2 and printed circuit board 3 separately.

Figure 6:
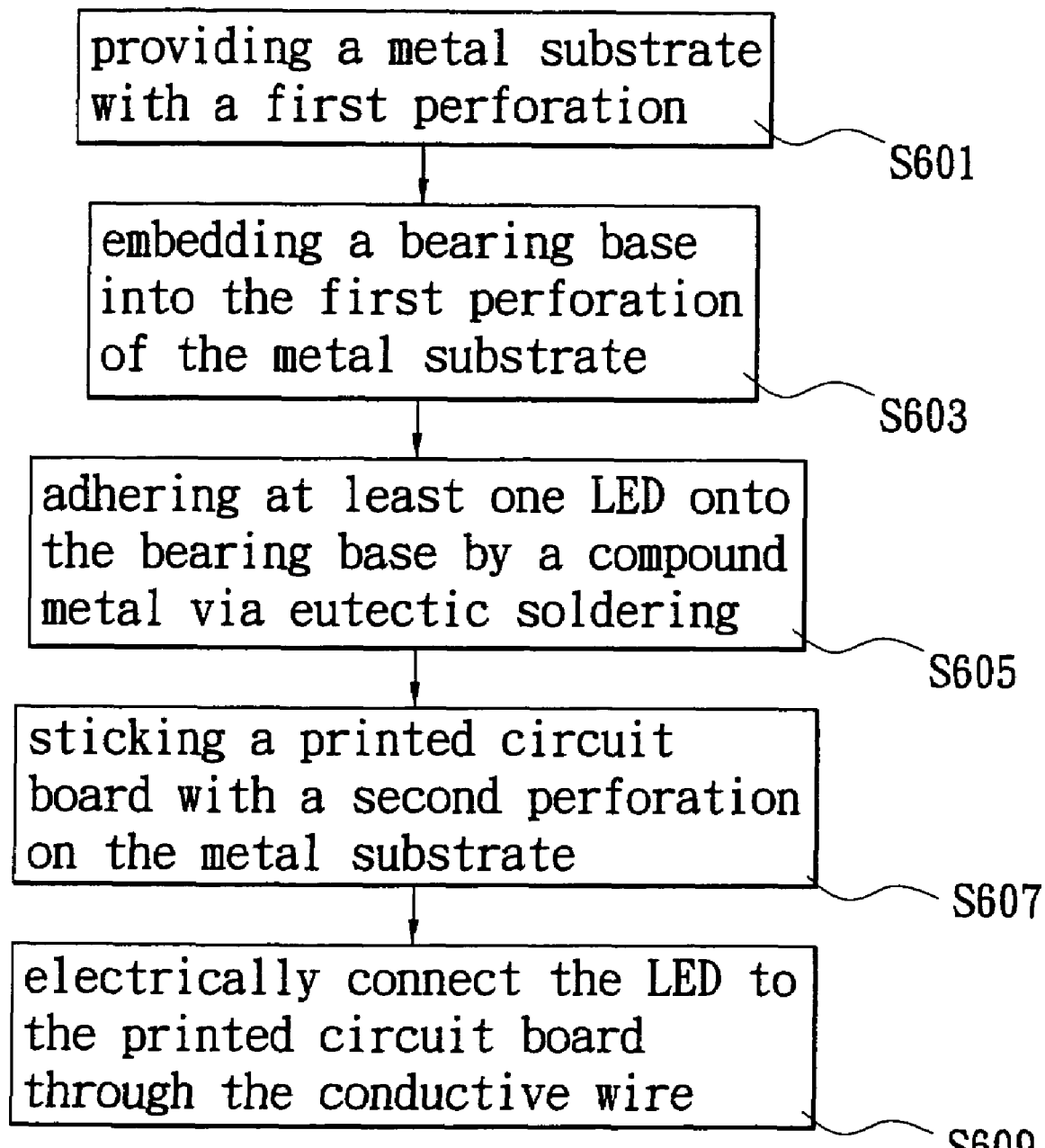
FIG. 6 is a process flowchart which illustrates a light emitting module according to an embodiment of the present invention.

Please refer to FIG. 6, which illustrates a process flowchart for a light emitting module according to an embodiment of the present invention. The process comprises the steps of: providing a metal substrate 1 with a first perforation 101 (step S601), wherein the material of the metal substrate 1 may be copper or aluminum. A bearing base 5 is embedded into the first perforation 101 of the metal substrate 1 (step S603), wherein the metal of the bearing base 5 may be one kind of metal, such as copper, and the surface layer of the bearing base 5 may be electroplated by gold or silver. Next, at least one LED 2 is adhered onto the bearing base 5 by a compound metal 21 via the method of eutectic soldering (as shown in FIG. 3) (step S605), wherein the compound metal 21 consists of gold and tin, or silver and tin. The electroplated surface layer of the bearing base 5 mentioned above increases the rate of reflection and improves the quality of adhesion when LED 2 is eutectic soldered with the compound metal 21. Furthermore, a printed circuit board 3 with a second perforation 301 is stuck on the metal substrate 1 by using an insulation colloid 30, such as a resin or epoxy (as shown in FIG. 3) (step S607), wherein the second perforation 301 exposes the LED 2 which is located on the bearing base 5, such that the LED top surface 8 is positioned substantially below the top surface 7 of the printed circuit board 3. Additionally, the printed circuit board 3 has an electronic circuit (not shown in Figs) to control LED 2 for radiating. Then the LED 2 is electrically connected to the printed circuit board 3 through at least one conductive wire 4 (step S609).

Due to the operating temperature that is required during the step of eutectic soldering being about 280° C. or more, the die attached process must be performed with the compound material used before step S605. Because of the same reason, those steps or materials which can not tolerate the high temperatures that occur in the process of the present invention must be performed after the eutectic soldering step.

There exist a variety of ways to configure the bearing base 5 and the metal substrate 1 as described below.

Figure 7:
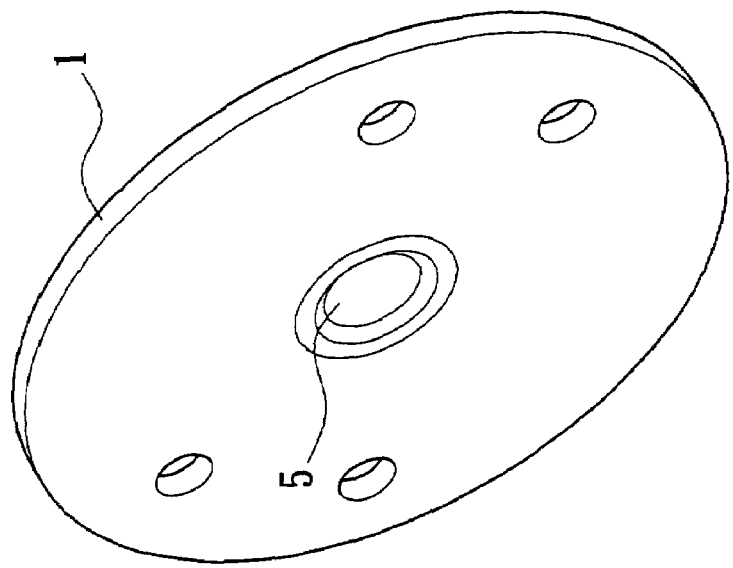
FIG. 7 is a schematic view which illustrates a relationship between the bearing base and the metal substrate according to a first embodiment of the present invention.

Please refer to FIG. 7, which illustrates a first configuration of the bearing base and the metal substrate 1. Both of the bearing base 5 and the metal substrate 1 represent as a singular element instead of separate ones. When the metal substrate 1 is milled out, the bearing base 5 is formed on the metal substrate 1 directly. The metal substrate 1 integrated with bearing base 5 is then electroplated with gold or silver on its surface (not shown in the Figs).

Figure 8:
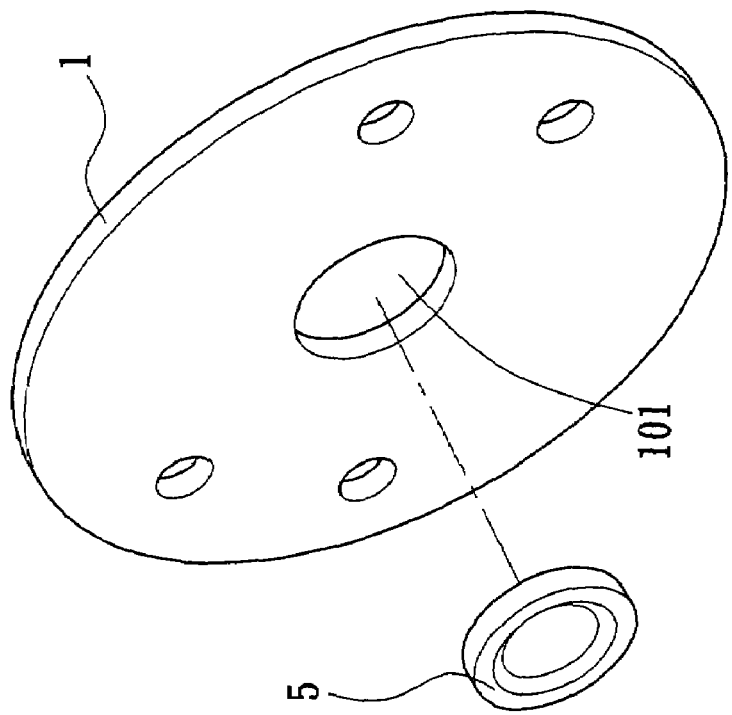
FIG. 8 is an explored view which illustrates a relationship between the bearing base and the metal substrate according to a second embodiment of the present invention.

Please refer to FIG. 8, which is an explored schematic view illustrating a second configuration of the bearing base 5 and the metal substrate 1. The bearing base 5 is riveted to the metal substrate 1 through the first perforation 101.

Figure 9:
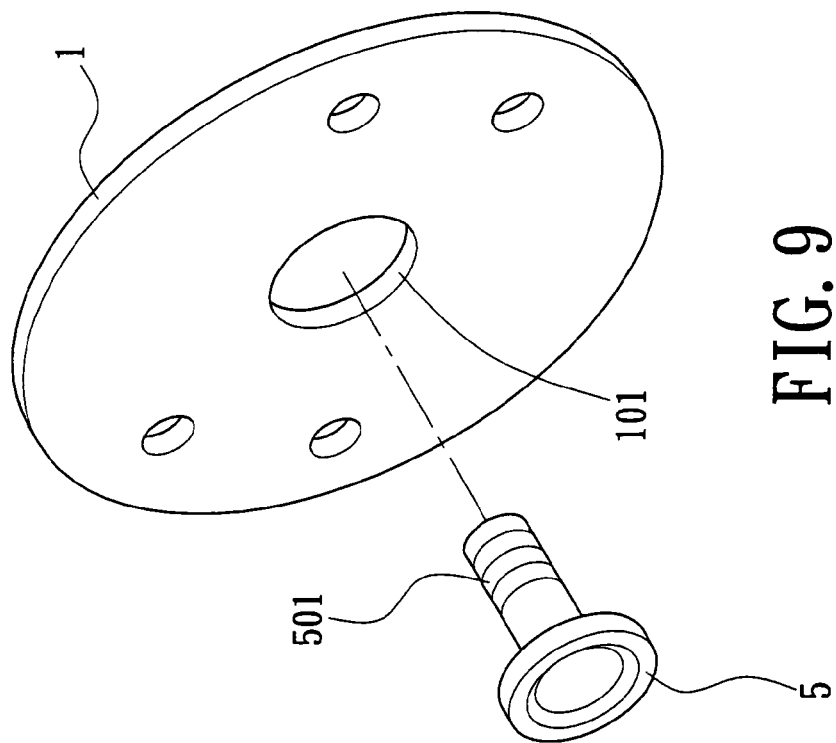
FIG. 9 is an explored view which illustrates a relationship between the bearing base and the metal substrate according to a third embodiment of the present invention.

Please refer to FIG. 9, which is an explored schematic view illustrating a third configuration of the bearing base 5 and the metal substrate 1. The bearing base 5 is riveted to the metal substrate 1 through the first perforation 101. The bearing base 5 further has a screw pillar 501, which penetrates and forms the other side of the metal substrate 1 for locking into a back part, such as a lamp structure or a heat dissipation device, to strengthen the heat dissipation effect.

Figure 10:
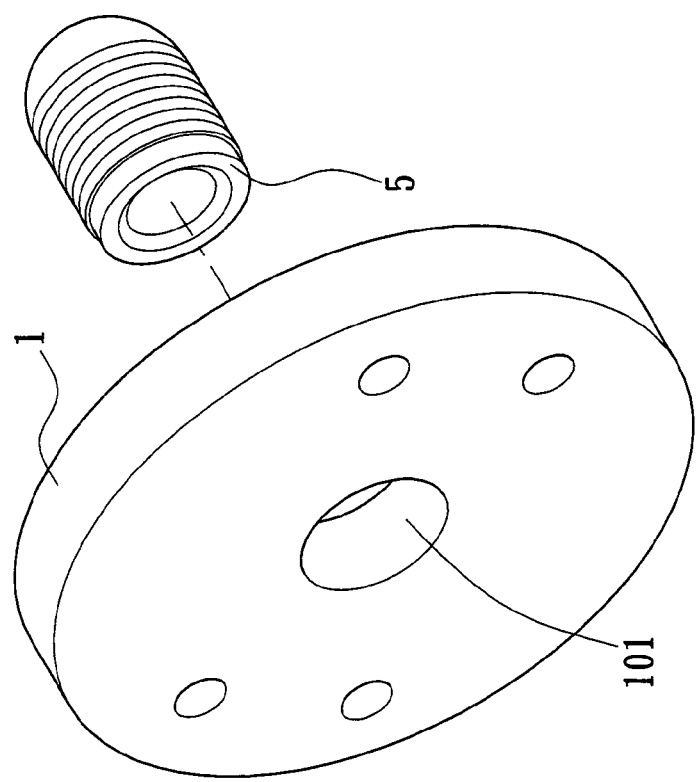
FIG. 10 is an explored view which illustrates a relationship between the bearing base and the metal substrate according to a fourth embodiment of the present invention.

Please refer to FIG. 10, which is an explored schematic view illustrating a fourth configuration of the bearing base 5 and the metal substrate 1. The first perforation 101 of metal substrate 1 is threaded (as a crew nut). The bearing base 5 itself has a screw shape and passes through the first perforation 101 that can be locked into the metal substrate 1 by screwing.

According to the above-mentioned technological means, the present invention utilizes the compound metal 21 to proceed eutectic soldering, and not only conducts out heat energy to the outer medium effectively and efficiently but further increases the radiating rate and prolongs lifespan.

Obviously many modifications and variations are possible in light of the above teachings. It is therefore to be understood that within the scope of the appended claims the present invention can be practiced other than as specifically described herein. Although specific embodiments have been illustrated and described herein, it is obvious to those who are skilled in the art that many modifications of the present invention may be made without departing from what is intended to be limited solely by the appended claims.

What is claimed is:

1. A light emitting module, comprising:
   a metal substrate having a first perforation;
   a bearing base embedded in the first perforation of the metal substrate, the bearing base having a recess defined therein;
   at least one LED adhered within the recess on the bearing base by eutectic soldering with a compound metal, wherein the compound metal consists of gold and tin, or silver and tin;
   a printed circuit board having a second perforation, the printed circuit board stuck on the metal substrate, the second perforation is formed on the printed circuit board and exposes the LED, wherein the LED is positioned within the recess such that a first top surface of the LED is positioned substantially below a first top surface of the printed circuit board, and further allows the printed circuit board to be stuck on the metal substrate; and
   at least one conductive wire used to electrically connect the LED with the printed circuit board;
   wherein the printed circuit board is stuck on the metal substrate after the LED is adhered on the bearing base by eutectic soldering.

2. The light emitting module according to claim 1, wherein the material of the metal substrate is copper or aluminum.

3. The light emitting module according to claim 1, wherein the size of the first perforation corresponds to the size of the bearing base, which is formed by a metal material of copper, and the surface layer of the bearing base is electroplated by gold or silver.

4. The light emitting module according to claim 1, wherein the bearing base and the metal substrate both are represented as a singular element.

5. The light emitting module according to claim 1, wherein the bearing base is riveted in the metal substrate through the first perforation.

6. The light emitting module according to claim 5, wherein the bearing base further has a screw pillar.

7. The light emitting module according to claim 1, wherein the bearing base further comprises a screw shaped element to screw to the screw shaped first perforation of the metal substrate.

8. The light emitting module according to claim 1, wherein an insulation colloid is located between the printed circuit board and the metal substrate, and an essential element in the insulation colloid is a resin or epoxy.

9. The light emitting module according to claim 1, wherein the printed circuit board has an electronic circuit to control the LED for radiating.

10. A process for a light emitting module, comprising:
    providing a metal substrate with a first perforation;
    embedding a bearing base into the first perforation of the metal substrate;
    adhering at least one LED within a recess defined in the bearing base via eutectic soldering with a compound metal;
    sticking a printed circuit board with a second perforation on the metal substrate, wherein the second perforation exposes the LED which is located within the recess of the bearing base, such that a first top surface of the LED is positioned substantially below a first top surface of the printed circuit board; and
    electrically connecting the LED to the printed circuit board through at least one conductive wire;
    wherein the printed circuit board is stuck on the metal substrate after the LED is adhered on the bearing base via eutectic soldering.

11. The process for the light emitting module according to claim 10, wherein the material of the metal substrate is copper or aluminum.

12. The process for the light emitting module according to claim 10, wherein the bearing base is formed by a copper metal material and has a surface layer, which is electroplated by gold or silver.

13. The process for the light emitting module according to claim 10, wherein the bearing base and the metal substrate both are represented as a singular element.

14. The process for the light emitting module according to claim 10, wherein the bearing base is riveted in the metal substrate through the first perforation.

15. The process for the light emitting module according to claim 14, wherein the bearing base further has a screw pillar.

16. The process for the light emitting module according to claim 10, wherein the bearing base further comprises a screw shaped element to screw to the screw shaped first perforation of the metal substrate.

17. The process for the light emitting module according to claim 10, wherein the compound metal consists of gold and tin, or silver and tin.

18. The process for the light emitting module according to claim 10, wherein the printed circuit board is stuck on the metal substrate through an insulation colloid, and an essential element in the insulation colloid is a resin or epoxy.

19. The light emitting module according to claim 10, wherein the printed circuit board has an electronic circuit to control the LED for radiating.

* * * * *